US009224612B2

(12) United States Patent
Kim et al.

(10) Patent No.: US 9,224,612 B2
(45) Date of Patent: Dec. 29, 2015

(54) VAPOR DEPOSITION APPARATUS, METHOD OF FORMING THIN FILM BY USING VAPOR DEPOSITION APPARATUS, AND METHOD OF MANUFACTURING ORGANIC LIGHT EMITTING DISPLAY APPARATUS

(71) Applicants: In-Kyo Kim, Yongin (KR); Myung-Soo Huh, Yongin (KR); Suk-Won Jung, Yongin (KR); Cheol-Min Jang, Yongin (KR); Jae-Hyun Kim, Yongin (KR); Jin-Kwang Kim, Yongin (KR); Chang-Woo Shim, Yongin (KR); Sung-Hun Key, Yongin (KR)

(72) Inventors: In-Kyo Kim, Yongin (KR); Myung-Soo Huh, Yongin (KR); Suk-Won Jung, Yongin (KR); Cheol-Min Jang, Yongin (KR); Jae-Hyun Kim, Yongin (KR); Jin-Kwang Kim, Yongin (KR); Chang-Woo Shim, Yongin (KR); Sung-Hun Key, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 5 days.

(21) Appl. No.: 13/795,943

(22) Filed: Mar. 12, 2013

(65) Prior Publication Data
US 2014/0113395 A1 Apr. 24, 2014

(30) Foreign Application Priority Data
Oct. 24, 2012 (KR) .................. 10-2012-0118677

(51) Int. Cl.
*C23C 16/54* (2006.01)
*H01L 21/30* (2006.01)
*H01L 51/52* (2006.01)
*C23C 16/455* (2006.01)
*H01L 51/56* (2006.01)

(52) U.S. Cl.
CPC .......... *H01L 21/30* (2013.01); *C23C 16/45538* (2013.01); *C23C 16/45551* (2013.01); *C23C 16/45578* (2013.01); *C23C 16/545* (2013.01); *H01L 51/52* (2013.01); *H01L 51/56* (2013.01)

(58) Field of Classification Search
CPC .................................................. C23C 16/54
See application file for complete search history.

(56) References Cited

U.S. PATENT DOCUMENTS

| 6,812,157 | B1 | 11/2004 | Gadgil | |
|---|---|---|---|---|
| 2002/0026984 | A1* | 3/2002 | Marxer et al. | 156/345 |
| 2003/0041971 | A1* | 3/2003 | Kido et al. | 156/345.33 |
| 2004/0067641 | A1* | 4/2004 | Yudovsky | 438/680 |

(Continued)

FOREIGN PATENT DOCUMENTS

| KR | 2003-502878 A | 1/2003 |
|---|---|---|
| KR | 10-2011-0078668 A | 7/2011 |

(Continued)

*Primary Examiner* — Zandra Smith
*Assistant Examiner* — Andre' C Stevenson
(74) *Attorney, Agent, or Firm* — Lee & Morse, P.C.

(57) ABSTRACT

A vapor deposition apparatus for depositing a thin film on a substrate includes a cover having an accommodation portion and a communicated portion, which communicated portion is connected to the accommodation portion and faces a direction of the substrate, and includes a body in the accommodation portion, which body includes a first portion and a second portion. The first portion is disposed at a first location of the body and connected to a first injection portion for injecting a first material onto the substrate, the second portion is disposed at a second location of the body and connected to a second injection portion for injecting a second material onto the substrate, and the body rotates in at least one direction so that the first portion and the second portion are alternately connected to each other with respect to the communicated portion.

14 Claims, 13 Drawing Sheets

(56) References Cited

U.S. PATENT DOCUMENTS

| | | |
|---|---|---|
| 2007/0221129 A1 | 9/2007 | Bae et al. |
| 2009/0291209 A1 | 11/2009 | Granneman et al. |
| 2010/0041213 A1 | 2/2010 | Lee |
| 2012/0315394 A1* | 12/2012 | Ito .............................. 427/255.5 |
| 2013/0122711 A1* | 5/2013 | Marakhtanov et al. ....... 438/711 |

FOREIGN PATENT DOCUMENTS

| | | |
|---|---|---|
| KR | 10-2012-0070195 A | 6/2012 |
| WO | WO 2009/142488 A1 | 11/2009 |

* cited by examiner

VAPOR DEPOSITION APPARATUS, METHOD OF FORMING THIN FILM BY USING VAPOR DEPOSITION APPARATUS, AND METHOD OF MANUFACTURING ORGANIC LIGHT EMITTING DISPLAY APPARATUS

CROSS-REFERENCE TO RELATED APPLICATION

This application claims priority under 35 U.S.C. §119 to Korean Patent Application No. 10-2012-0118677, filed on Oct. 24, 2012, in the Korean Intellectual Property Office, and entitled: "Vapor Deposition Apparatus, Method of Forming Thin Film by Using Vapor Deposition Apparatus, and Method of Manufacturing Organic Light Emitting Display Apparatus," the disclosure of which is incorporated herein in its entirety by reference.

BACKGROUND

Semiconductor devices, display devices, and other electronic devices include a plurality of thin films. Various methods may be used to form the plurality of thin films, one of which is a vapor deposition method.

SUMMARY

Embodiments may be realized by providing a vapor deposition apparatus for depositing a thin film on a substrate, the vapor deposition apparatus including a cover including an accommodation portion and a communicated portion connected to the accommodation portion and formed in a direction of the substrate, and a body disposed in the accommodation portion and including a first portion and a second portion. The first portion is disposed at a first location of the body and connected to a first injection portion for injecting a first material into the substrate, the second portion is disposed at a second location of the body and connected to a second injection portion for injecting a second material into the substrate, and the body rotates in at least one direction so that the first portion and the second portion are alternately connected to each other with respect to the communicated portion.

The cover may further include an exhaust portion connected to the accommodation portion. A gap for performing an exhaust operation may be formed between an inner surface of the accommodation portion and an outer surface of the body.

The cover may have a polyhedric shape, and the communicated portion and the exhaust portion may be formed in different surfaces. The surface in which the communicated portion is formed and the surface in which the exhaust portion is formed may face each other. The exhaust portion may be plural and formed in different surfaces.

The first portion and the second portion may be spaced apart from each other. The body may be a cylindrical shape, and the first portion and the second portion may be disposed on a surface of the body along a circumference of the body. The first portion and the second portion may be spaced apart from each other by a diameter of a bottom surface of the body.

The vapor deposition apparatus may further include a cavity connected to the first injection portion, and a plurality of electrodes for generating a radical by applying a voltage to the first material in the cavity. The first material may include one or more gases selected from the group of a source precursor, a reactant precursor, inert gas, or a combination thereof.

The vapor deposition apparatus may further include a cavity connected to the second injection portion, and a plurality of electrodes for generating a radical by applying a voltage to the second material in the cavity. The second material may include one or more gases selected from the group of a source precursor, a reactant precursor, inert gas, or a combination thereof. A plurality of vapor deposition apparatuses may be continuously disposed in a direction in which the substrate moves, and include exhaust lines for performing the exhaust operation therebetween.

Embodiments may also be realized by providing a method of depositing a thin film on a substrate using a vapor deposition apparatus. The vapor deposition apparatus includes a cover including an accommodation portion, an exhaust portion connected to the accommodation portion, and a communicated portion connected to the accommodation portion and formed in a direction of the substrate; and a body disposed in the accommodation portion and including a first portion and a second portion. The first portion is disposed at a first location of the body and connected to a first injection portion for injecting a first material into the substrate, the second portion is disposed at a second location of the body and connected to a second injection portion for injecting a second material into the substrate, the body rotates in at least one direction so that the first portion and the second portion are alternately connected to each other with respect to the communicated portion. The method includes, when the body rotates in one direction and the first injection inlet and the communicated portion are connected to each other, injecting the first material into the substrate, exhausting a part of the first material injected through the exhaust portion when the body rotates in one direction, when the body rotates in one direction and the second injection inlet and the communicated portion are connected to each other, injecting the second material into the substrate; exhausting a part of the second material injected through the exhaust portion when the body rotates in one direction.

The second material may include one or more gases selected from the group of a source precursor, a reactant precursor, inert gas or a combination thereof. The method may further include generating a radical of the second material in a cavity connected to the second injection inlet by applying voltages to a plurality of electrodes included in the vapor deposition apparatus. The substrate may be fixed to the vapor deposition apparatus.

The substrate may relatively move with respect to the vapor deposition apparatus, and a plurality of vapor deposition apparatuses may be continuously disposed in a direction in which the substrate moves. In the exhausting of the part of the second material injected through the exhaust portion when the body rotates in one direction, the substrate may move to a next vapor deposition apparatus.

Each of the plurality of vapor deposition apparatuses may rotate at the same angular speed. A moving speed of the substrate may be connected to an angular speed of the body.

Embodiments may also be realized by providing a method of manufacturing an organic light-emitting display apparatus that includes a thin film formed on a substrate using a vapor deposition apparatus, which the thin film includes at least first electrode, an interlayer including an organic emissive layer, a second electrode, and an encapsulation layer. The vapor deposition apparatus includes a cover including an accommodation portion, an exhaust portion connected to the accommodation portion, and a communicated portion connected to the accommodation portion and formed in a direction of the substrate, and a body disposed in the accommodation portion and including a first portion and a second portion. The first portion is disposed at a first location of the body and connected to a first injection portion for injecting a first material into the substrate, the second portion is disposed at a second location of the body and connected to a second injection portion for injecting a second material into the substrate, and the body rotates in at least one direction so that the first portion and the second portion are alternately connected to each other with respect to the communicated portion. A method of forming the thin film on the substrate includes when the body rotates in one direction and the first injection inlet and the communicated portion are connected to each other, injecting the first material into the substrate, exhausting a part of the first material injected through the exhaust portion when the body rotates in one direction, when the body rotates in one direction and the second injection inlet and the communicated portion are connected to each other, injecting the second material into the substrate, exhausting a part of the second material injected through the exhaust portion when the body rotates in one direction.

The method of forming of the thin film may include forming the encapsulation layer disposed on the second electrode. The method of forming of the thin film may include forming an insulation film. The method of forming of the thin film may include forming a conductive film.

BRIEF DESCRIPTION OF THE DRAWINGS

Features will become more apparent by describing in detail exemplary embodiments thereof with reference to the attached drawings in which.

DETAILED DESCRIPTION

Figure 1:
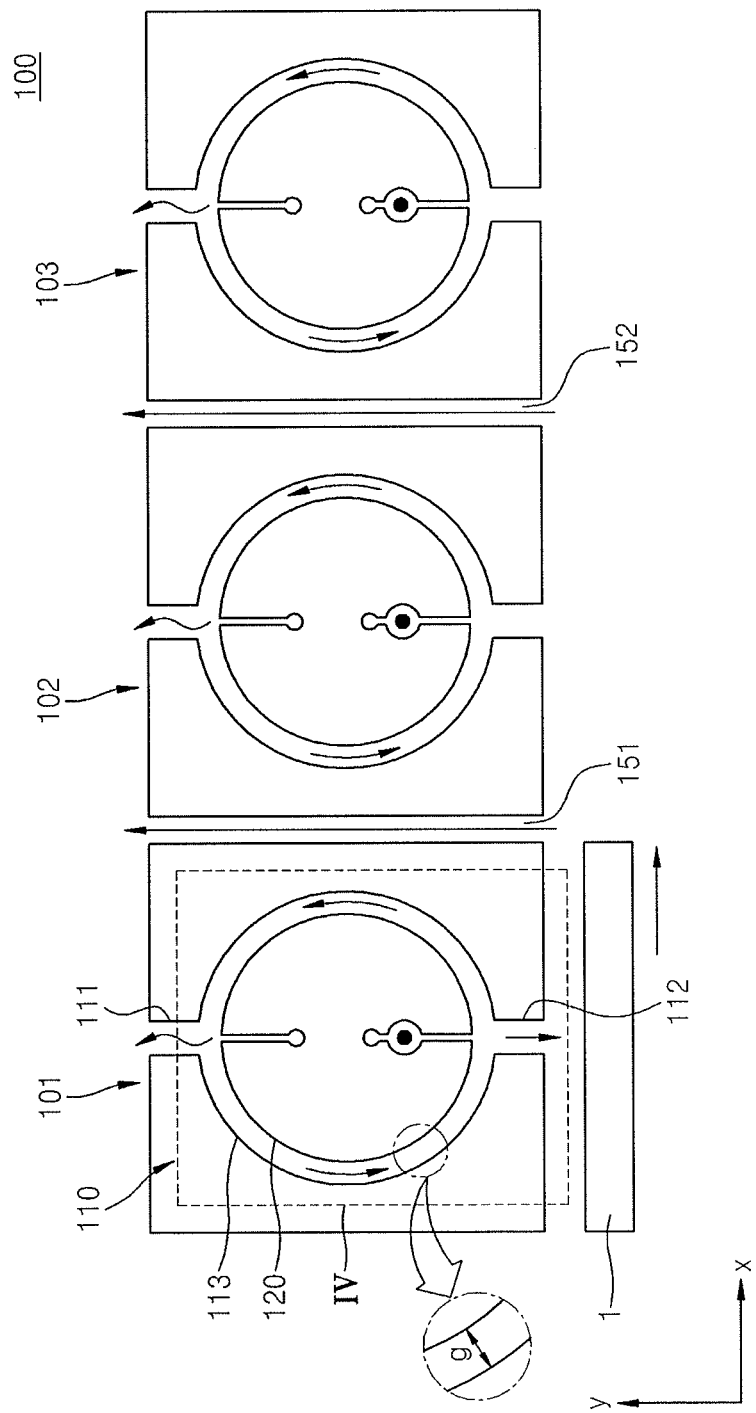
FIG. 1 is a schematic cross-sectional view of a vapor deposition system according to an exemplary embodiment.

As the invention allows for various changes and numerous embodiments, embodiments will be illustrated in the drawings and described in detail in the written description. However, this is not intended to limit the embodiments to particular modes of practice, and it is to be appreciated that all changes, equivalents, and substitutes that do not depart from the spirit and technical scope are encompassed in the embodiments. In the description, certain detailed explanations of related art are omitted when it is deemed that they may unnecessarily obscure the essence of the embodiments.

The terms such as "first" and "second" are used herein merely to describe a variety of constituent elements, but the constituent elements are not limited by the terms. The terms are used only for the purpose of distinguishing one constituent element from another constituent element.

Embodiments will now be described more fully with reference to the accompanying drawings, in which exemplary embodiments are shown.

Figure 2:
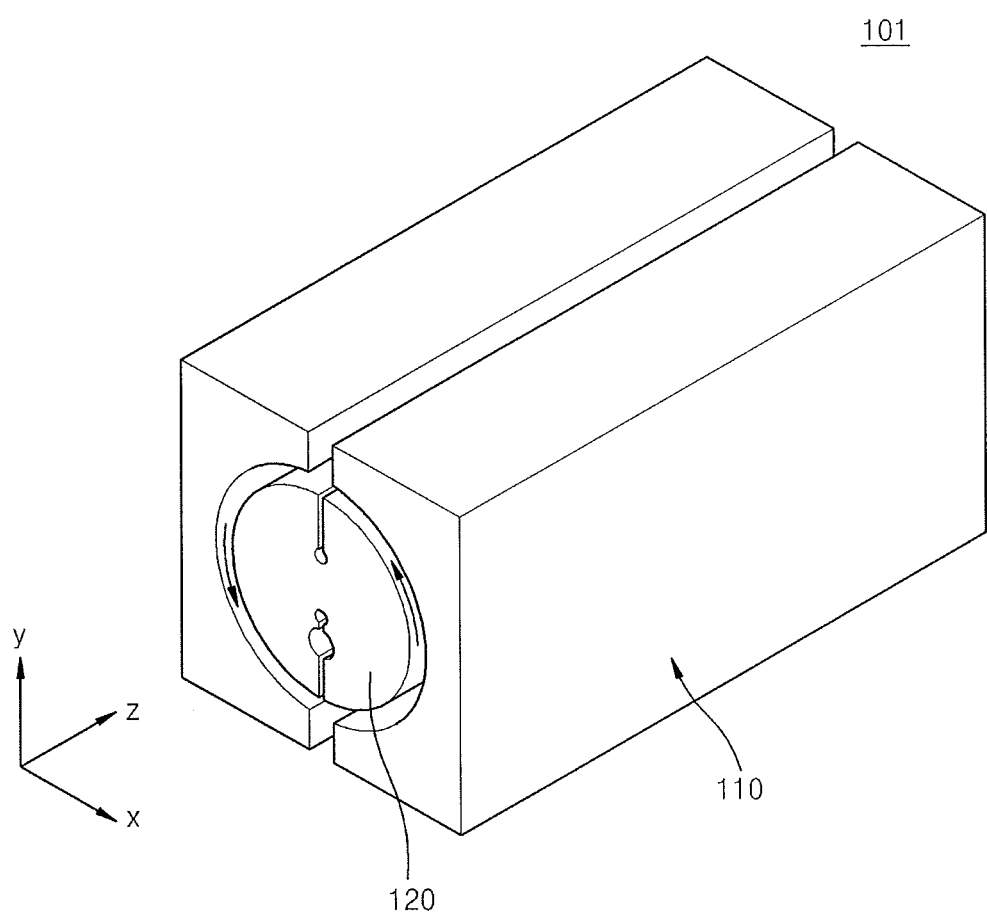
FIG. 2 is a perspective view of the vapor deposition system of FIG. 1.
Figure 3:
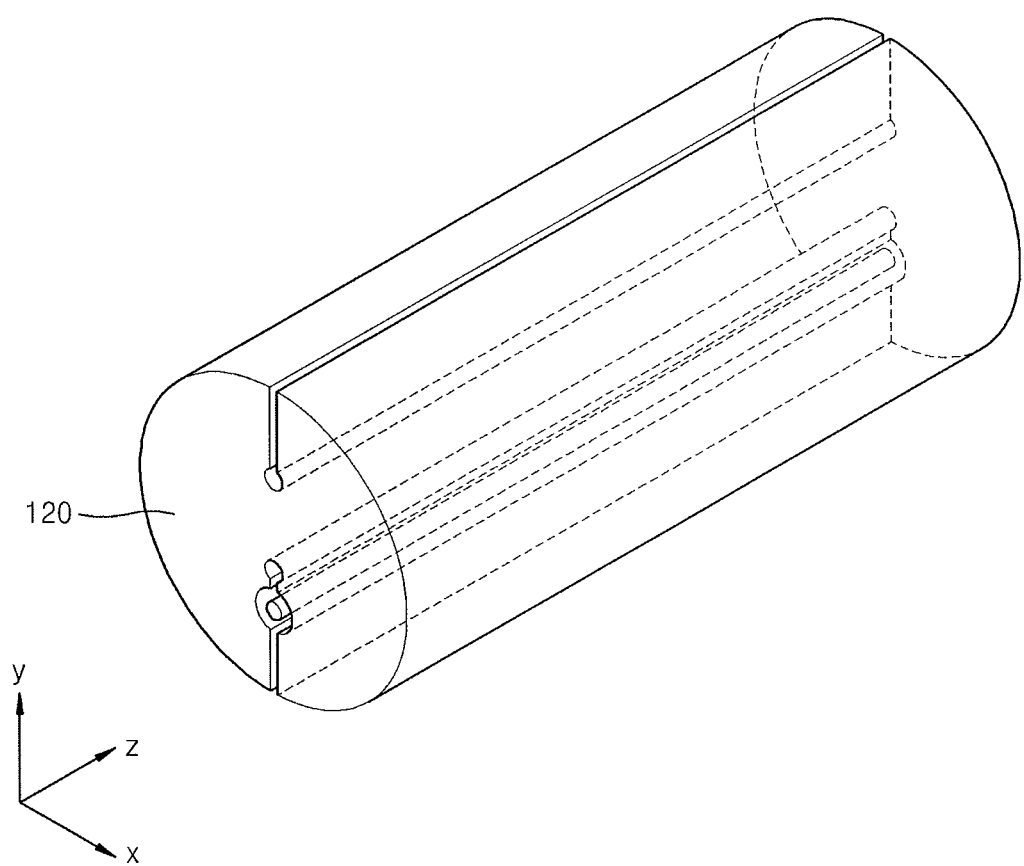
FIG. 3 is a projective perspective view of a body of the vapor deposition system of FIG. 1.
Figure 4:
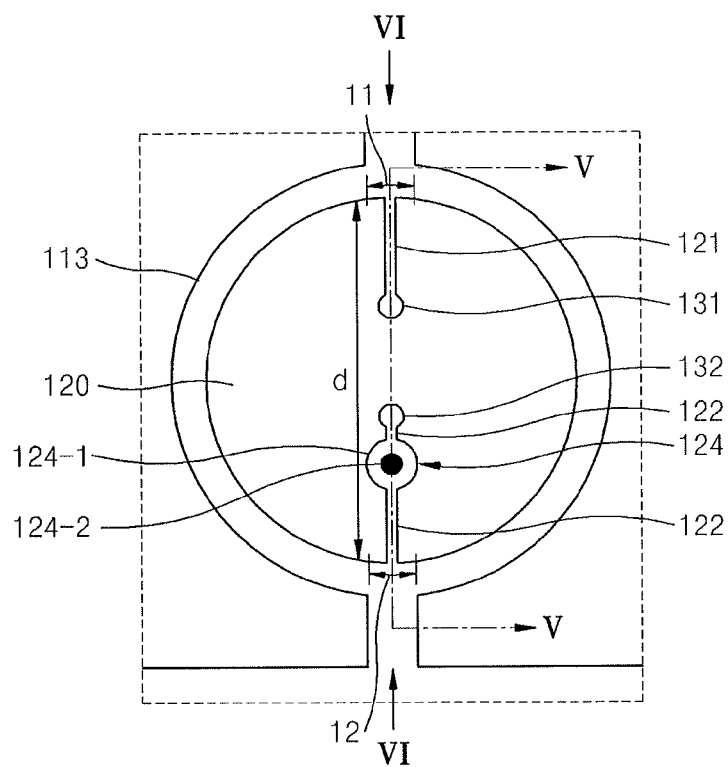
FIGS. 4 and 5 are cross-sectional and longitudinal-sectional views, respectively, of a body.
Figure 5:
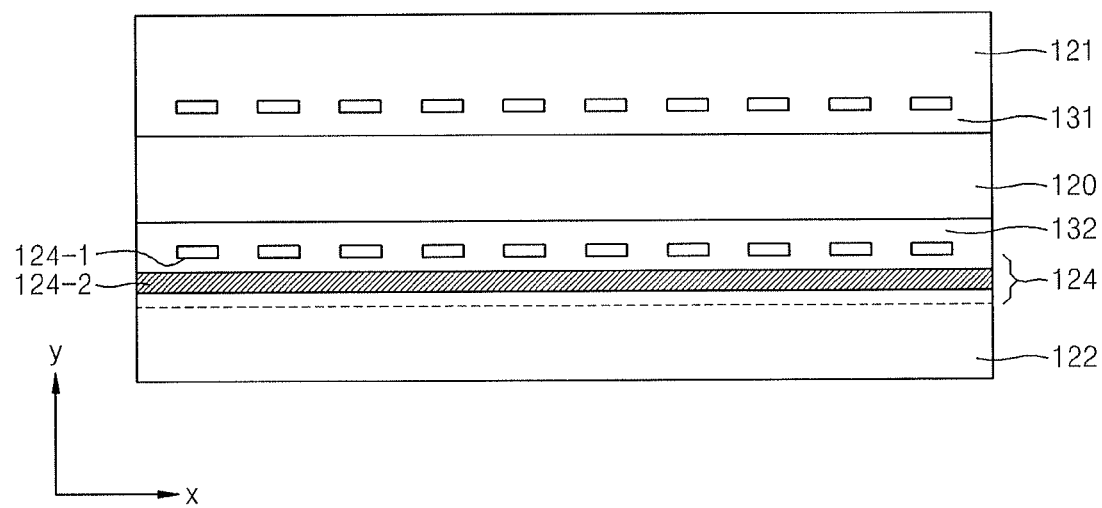
Figure 6:
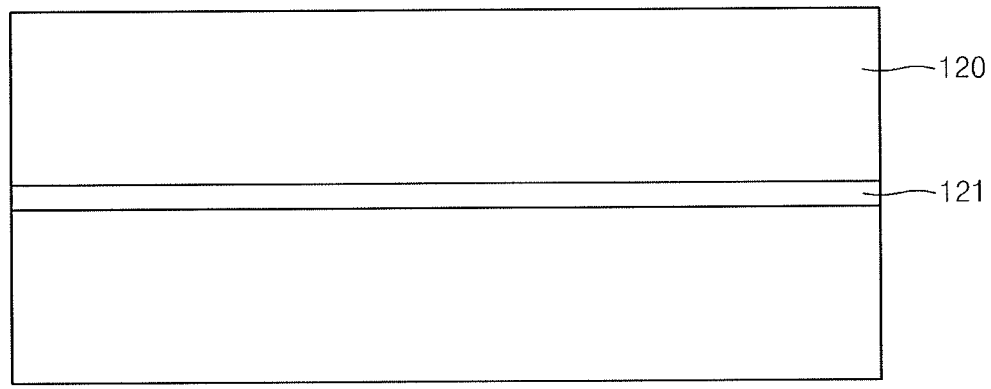
FIGS. 6 and 7 are rear and bottom views, respectively, of a body.
Figure 7:
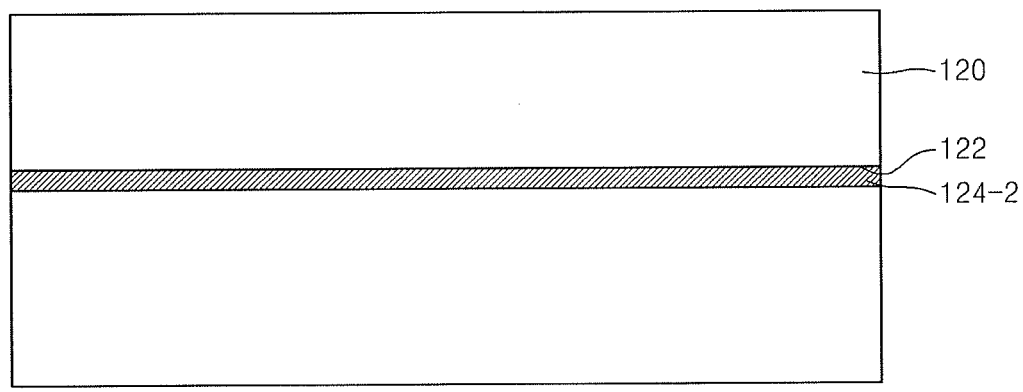
Figure 8:
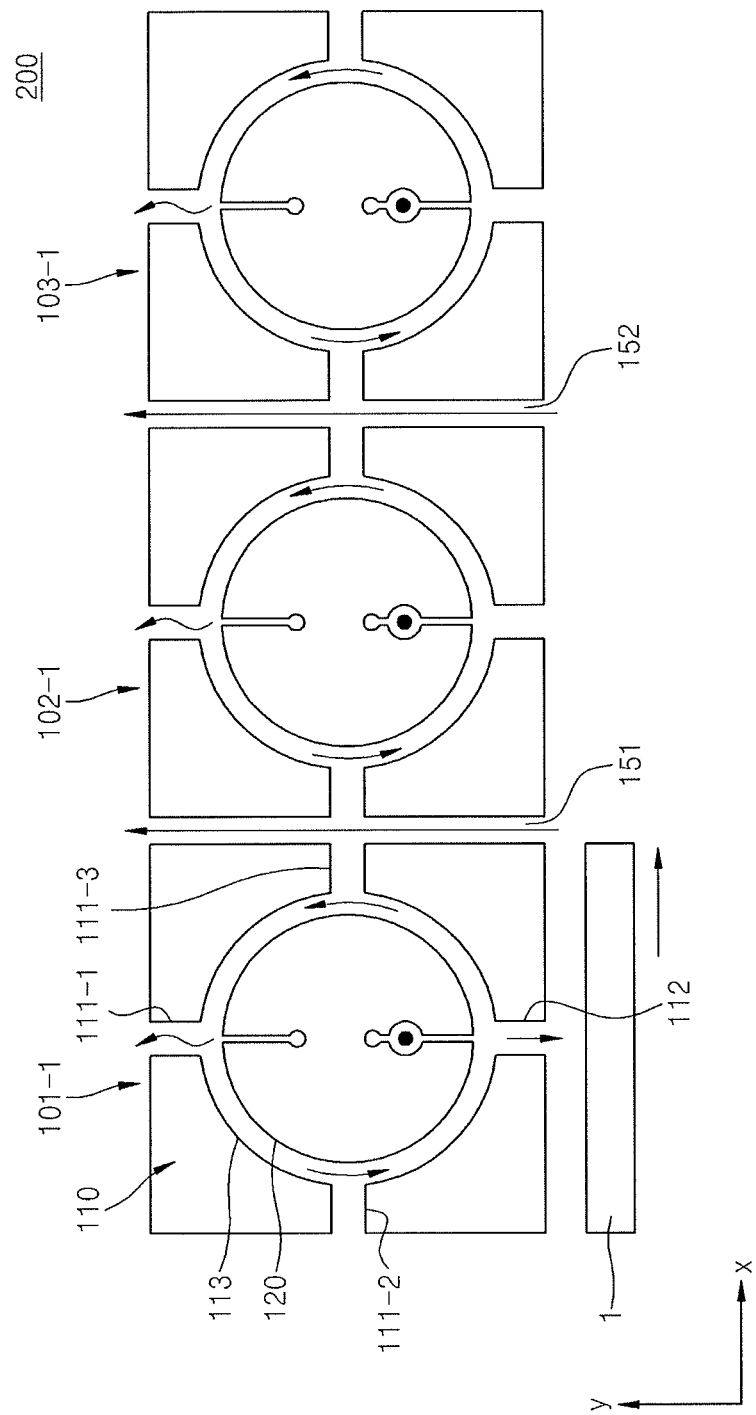
FIGS. 8 and 9 are schematic cross-sectional views of vapor deposition systems according to exemplary embodiments.
Figure 9:
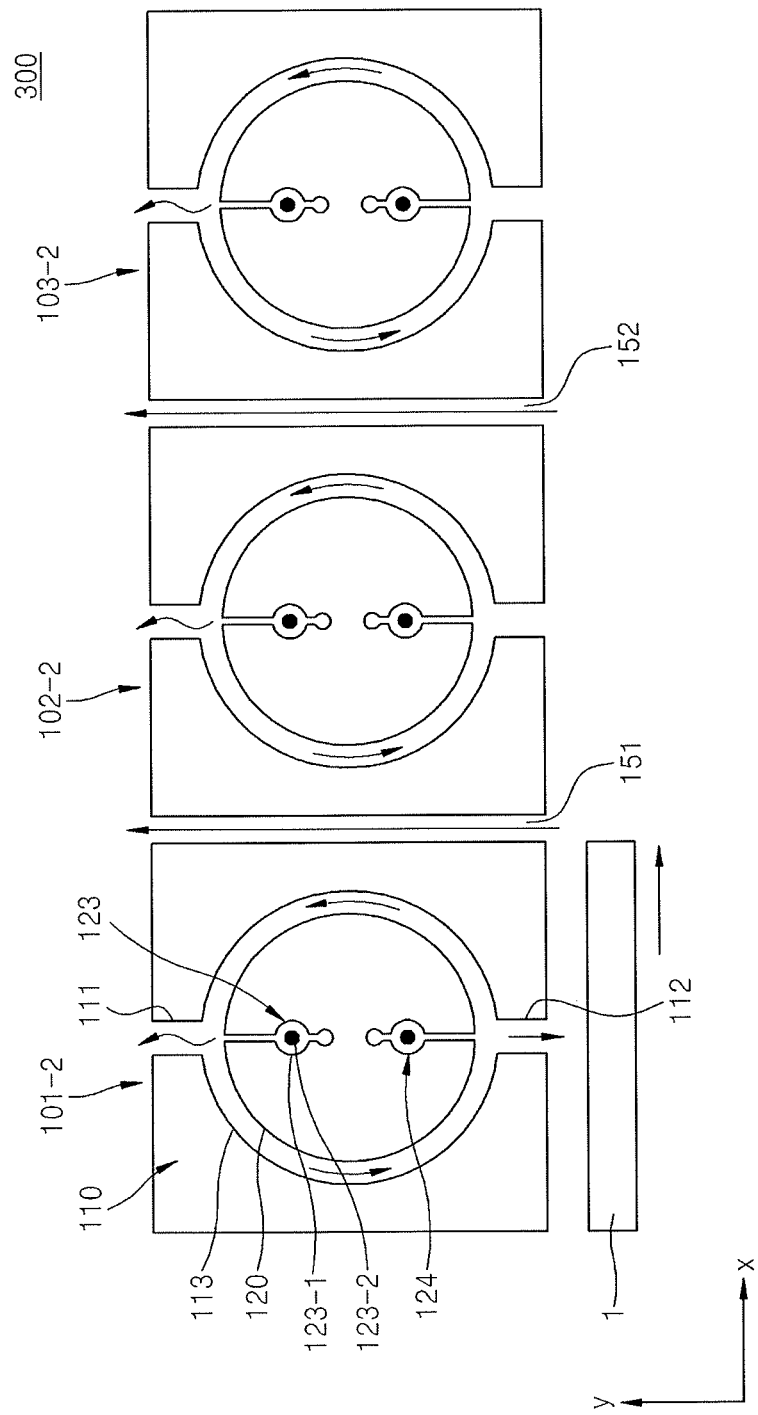

FIG. 1 is a schematic cross-sectional view of a vapor deposition system 100 according to an exemplary embodiment. FIG. 2 is a perspective view of the vapor deposition system 100 of FIG. 1. FIG. 3 is a projective perspective view of a body 120 of the vapor deposition system 100 of FIG. 1. FIGS. 4 and 5 are cross-sectional and longitudinal-sectional views of the body 120. FIGS. 6 and 7 are rear and bottom views of the body 120. FIGS. 8 and 9 are schematic cross-sectional views of vapor deposition systems 200 and 300 according to other exemplary embodiments.

The vapor deposition system 100 of FIG. 1 includes three vapor deposition apparatuses 101, 102, and 103 that are consecutively disposed in an X direction to which a substrate 1 moves. However, this is merely exemplary. The number of the vapor deposition apparatuses 101, 102, and 103 included in the vapor deposition system 100 is not limited thereto. For example, one vapor deposition apparatus or four vapor deposition apparatuses may be disposed in the vapor deposition system 100.

Exhaust lines 151 and 152 for exhaust are disposed between the vapor deposition apparatuses 101, 102, and 103. The exhaust lines 151 and 152 pump and exhaust materials in a direction of an arrow shown in FIG. 1. The exhaust lines 151 and 152 exhaust materials that are not chemically adsorbed to the substrate 1, thereby enhancing purity of a deposition film that is to be formed.

Each of the vapor deposition apparatuses 101, 102, and 103 includes a cover 110 and the body 120.

The cover 110 may support the body 120 and have a polyhedric shape. In this regard, any polyhedrons in column shapes having a plurality sides may be applied to a polyhedron, in addition to a rectangle in FIGS. 1 and 2. The cover 110 includes an accommodation portion 113 that accommodates the body 120. Also, the cover 110 includes an exhaust portion 111 and a communicated portion 112 that are connected to the accommodation portion 113.

The exhaust portion 111 functions to exhaust the materials that are not chemically adsorbed to the substrate 1. The exhaust portion 111 pumps and exhausts a material in the arrow direction.

The communicated portion 112 is connected to the accommodation portion 113 and provides a path onto the substrate 1 on which a material is injected when the body 120 rotates and is disposed at a location at which an injection inlet of the body 120 and the communicated portion 112 are connected to each other. That is, the communicated 112 is defined as the path onto the substrate 1 which the material is injected.

The exhaust portion 111 and the communicated portion 112 may be formed at different surfaces of the cover 110. The communicated portion 112 is disposed closer to the substrate 1. The exhaust portion 111 needs to exhaust the material away from the substrate 1 by pumping the material and thus is disposed farther from the substrate 1. For example, the communicated portion 112 is formed at one surface of the cover 110 facing the substrate 1. The communicated portion 112 may be formed at the surface facing gravity of a surface vector of the cover 110. The exhaust portion 111 is formed at one surface of the cover 110 opposite to the communicated portion 112.

FIG. 8 is a schematic cross-sectional view of the vapor deposition system 200 according to another exemplary embodiment. A plurality of exhaust portions 111-1, 111-2, and 111-3 may be formed in the cover 110 so as to increase exhaust performance in vapor deposition apparatuses 101-1, 102-1, and 103-1 of FIG. 8. The exhaust portions 111-1, 111-2, and 111-3 may be further formed at both sides of the cover 110 in addition to a surface corresponding to the communicated portion 112.

Referring to FIG. 1, a gap g for exhaust are formed between an inner surface of the accommodation portion 113 of the cover 110 and an outer surface of the body 120 accommodated in the accommodation portion 113. A material that is not chemically adsorbed to the substrate 1 is exhausted to the exhaust portion 111 through the gap g. Intervals between the gap g may be g as shown in FIG. 1.

Although not shown, the exhaust portion 111 and the exhaust lines 151 and 152 may further include purge portions. The purge portions may inject purge gas such as argon (Ar) gas or nitrogen ($N_2$) gas in a direction of the substrate 1 to allow a physical adsorption layer having a weak coupling force between molecules among adsorption layers formed on a top surface of the substrate 1 to be easily removed from the substrate 1.

The body 120 may have a cylindrical shape. However, at least a part of the body 120 may have the cylindrical shape. The body 120 is disposed inside the accommodation portion 113. Injection portions 121 and 122 are formed from the inside of the body 120 to the surface thereof. Channels 131 and 132 corresponding to the injection portions 121 and 122 are formed in the body 120. Each of the channels 131 and 132 extends in a lengthwise direction (in a Z direction) of the body 120 to carry a first material or a second material to the inside of the body 120.

The body 120 includes a single unit module including a first portion 11 and a second portion 12. Although the vapor deposition apparatuses 101, 102, and 103 include a single unit module in FIGS. 1 through 5, the number of unit modules is exemplary. That is, the vapor deposition apparatuses 101, 102, and 103 may include the body 120 including two or more unit modules.

The first portion 11 and the second portion 12 are portions disposed at the body 120 along the circumference of the cylindrical body 120, e.g., as illustrated in FIG. 4. The first portion 11 includes a surface and an inside of the surface. The first portion 11 is disposed at a first location of the body 120 and includes a first injection inlet 121 used to inject the first material onto the substrate 1. The first injection inlet 121 is connected to the first channel 131 through which the first material is carried.

The second portion 12 is disposed at a second location of the body 120 and includes a second injection inlet 122 used to inject the second material to the substrate 1. The second injection inlet 122 is connected to the second channel 132 through which the second material is carried. As shown in FIGS. 6 and 7, each of the first and second injection inlets 121 and 122 may have a long slit shape formed on the surface of the body 120 and extending in the lengthwise direction (in the Z direction) of the body 120. Accordingly, precursors or materials may be uniformly injected onto the substrate 1.

The first portion 11 and the second portion 12 are spaced apart from each other. For example, the first portion 11 and the second portion 12 are spaced apart from each other by a diameter d of a bottom surface of the body 120. An angle formed by the first portion 11 and the second portion 12 may be about 180 degrees. As described above, the first portion 11 and the second portion 12 are disposed to have a distance d therebetween farthest from the body 120, and thus a sufficient exhaust time and a sufficient time necessary for moving the substrate 1 may be secured. However, this is exemplary. In a case where a plurality of unit modules are disposed in the body 120, the first portion 11 and the second portion 12 may be spaced apart from each other by a distance smaller than the diameter d of the bottom surface of the body 120.

A cavity 124 may be further formed in and connected to the second injection inlet 122. The cavity 124 may have a cylindrical shape extending in the lengthwise direction (in the Z direction) of the body 120.

A plurality of electrodes 124-1 and 124-2 used to generate plasma may be disposed in the cavity 124. For example, the plurality of electrodes 124-1 and 124-2 may include outer and inner electrodes, respectively, having concentric cross-sectional shapes to generate coaxial capacitive type plasma. For example, the inner electrode 124-2 may have a linear type extending in the lengthwise direction (in the Z direction) of the body 120, and an inner surface of the cavity 124 may function as the outer electrode 124-1. However, this is exemplary. In another embodiment, an electrode structure used to generate plasma of a different type such as induction coupling plasma (ICP) may be used.

FIG. 9 is a schematic cross-sectional view of the vapor deposition system 300 according to another exemplary embodiment.

As occasion arises, another cavity 123 may be further formed in the first injection inlet 121 as shown in FIG. 9, in addition to the cavity 124 formed in the second injection inlet 122. In this regard, the cavity 123 may have a cylindrical shape extending in a lengthwise direction (e.g., in the Z-direction that is perpendicular to the X-direction and the Y-direction) of the body 120. A plurality of electrodes 123-1 and 123-2 used to generate plasma may be disposed in the cavity 123.

The cavity 124 is formed in the center of the first injection inlet 121 or the second injection inlet 122 to accommodate a first material or a second material carried from the channel 131 or 132 and to generate a radical of the first material or the second material by plasma generated by applying voltages to the plurality of electrodes 124-1 and 124-2. The radical of the first material or the second material may be injected toward the substrate 1 through the first injection inlet 121 or the second injection inlet 122. In this regard, the first material or the second material may include one or more gases selected from the group of a source precursor, a reactant precursor, inert gas or a combination thereof. Examples of the above-described materials will be described below when a method of forming a thin film is described.

In a case like FIG. 1 where the cavity 124 is formed at the first injection inlet 121 or the second injection inlet 122, the vapor deposition apparatuses 101, 102, and 103 may function as atomic layer deposition (ALD) apparatuses to form a monolayer thin film. In a case like FIG. 9 where the cavity 124 is formed at both sides of the first injection inlet 121 and the second injection inlet 122, the vapor deposition apparatuses 101, 102, and 103 may function as chemical vapor deposition (CVD) apparatuses to form a multilayer thin film.

The body 120 rotates in at least one direction so that the first portion 11 and the second portion 12 are alternatively connected to the communicated portion 112 of the cover 110. As long as the first portion 11 and the second portion 12 are alternatively connected, the body 120 may rotate in both directions. According to one embodiment, irrespective of whether the substrate 1 is fixed or moves relative to the vapor deposition apparatuses 101, 102, and 103, the body 120 of each of the vapor deposition apparatuses 101, 102, and 103 rotates in one direction, and thus another material may be deposited with respect to one of the vapor deposition apparatuses 101, 102, and 103 over time. Accordingly, sizes of the vapor deposition apparatuses 101, 102, and 103 may be minimized, and a film forming speed may be maximized in a limited space, thereby increasing a production yield.

Although not shown, the body 120 may rotate using various methods. For example, the body 120 may rotate by an individual power source. As another example, in a case where a plurality of the vapor deposition apparatuses 101, 102, and 103 are arranged as shown in FIG. 1, the body 120 of each of the vapor deposition apparatuses 101, 102, and 103 may concurrently rotate by one power source through a connecting rod. For example, the connecting rod for connecting the body 120 of each of the vapor deposition apparatuses 101, 102, and 103 may also function as a pipe used to carry materials to the channel 131 or 132 inserted into the body 120. A first connecting rod connected to the first channel 131 and a second connecting rod connected to the second channel 132 may be disposed at different surfaces (facing surfaces) of the body 120 to reduce the possibility of and/or prevent the first and second connecting rods from being overlapped or twisted when the body 120 rotates.

FIGS. 10 through 13 are schematic cross-sectional views for explaining a method of forming a thin film using the vapor deposition systems 100, 200, and 300 according to exemplary embodiments. FIG. 14 is a diagram for explaining a process of forming a thin film.

The vapor deposition system 100 of FIGS. 10 through 13 is the same as the vapor deposition system 100 of FIG. 1, and thus although the thin film may be formed using the vapor deposition systems 200 and 300 according to other embodiments, a representative embodiment will now be described for convenience of description. The plurality of vapor deposition apparatuses 101, 102, and 103 are hereinafter referred to as first through third vapor deposition apparatuses 101, 102, and 103 sequentially in a Y axis direction in FIGS. 10 through 13.

Referring to FIG. 14, a first material that is a source material is injected in operation A, a second material that is a reactant material is injected in operation B, and the first and second materials are pumped and exhausted in operation C.

The substrate 1 moves in an X direction in which the first through third vapor deposition apparatuses 101, 102, and 103 are arranged. That is, the substrate 1 moves in the X axis direction of FIG. 8. To this end, the substrate 1 may be installed in a stage (not shown), and move through a driving portion (not shown). Also, the first through third vapor deposition apparatuses 101, 102, and 103 may move in the X axis direction instead of the substrate 1.

The substrate 1 is disposed at a lower portion of the communicated portion 112 of the first vapor deposition apparatus 101.

Figure 10:
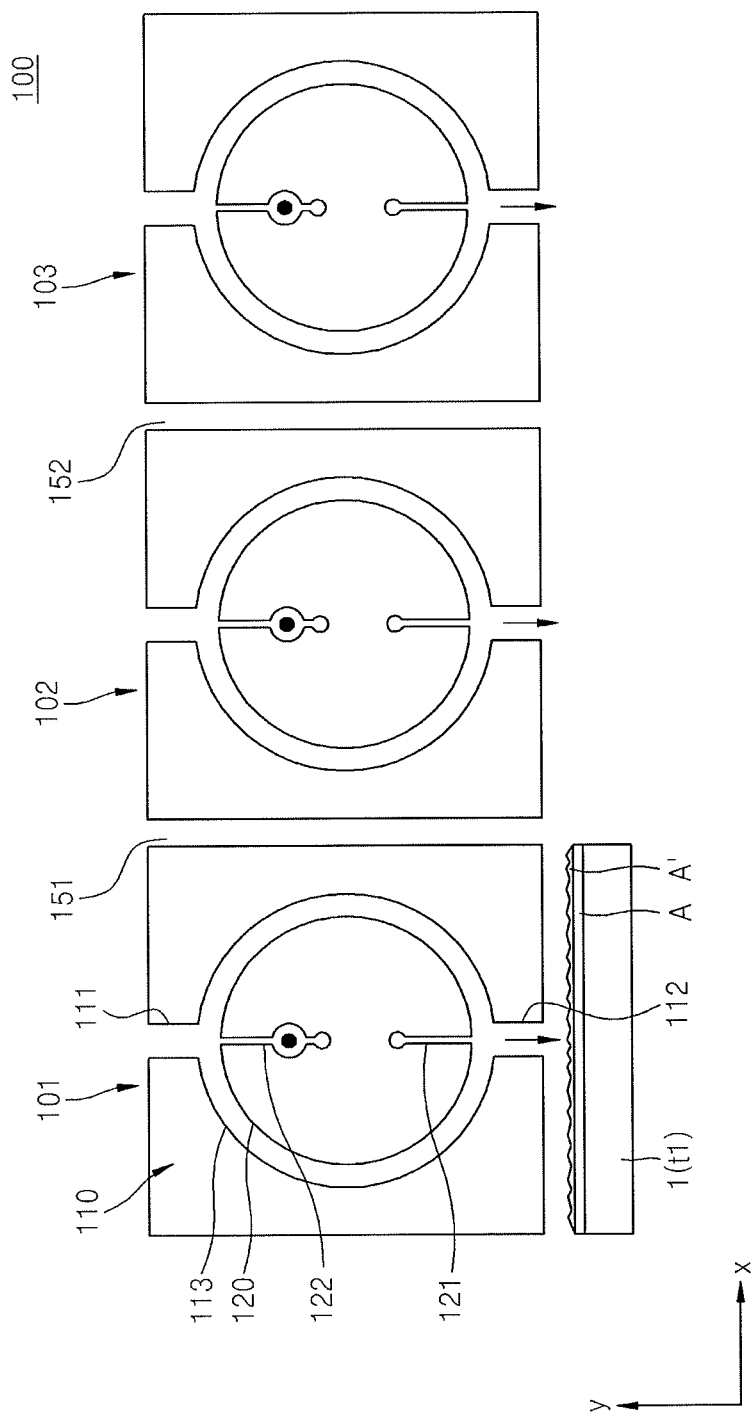
FIGS. 10 through 13 are schematic cross-sectional views for explaining a method of forming a thin film using the vapor deposition system of FIG. 1, according to exemplary embodiments.

Referring to FIG. 10, the body 120 of the first vapor deposition apparatus 101 rotates in one direction and injects the first material toward the substrate 1 through the first injection inlet 121 at a first time t1 at which the first injection inlet 121 and the communicated portion 112 are connected to each other. An example of the first material may be a gas containing an aluminum (Al) atom such as trimethyl aluminum (TMA). The first adsorption layer A containing Al is formed on a top surface of the substrate 1. For example, the first adsorption layer A includes a chemical adsorption layer A and a physical adsorption layer A' formed on the top surface of the substrate 1.

Figure 11:
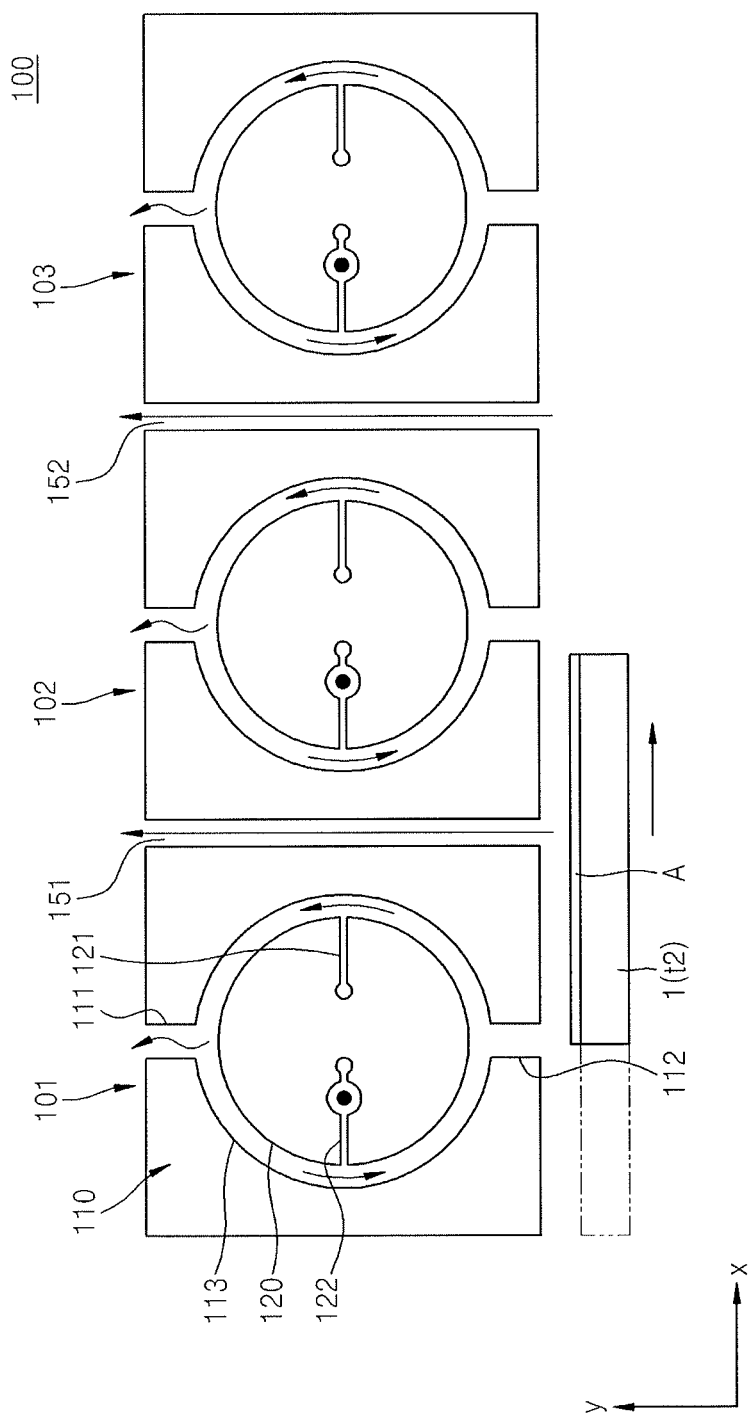

Referring to FIG. 11, next, the body 120 of the first vapor deposition apparatus 101 rotates in one direction and exhausts the first and second materials at a second time t2. For example, the physical adsorption layer having a weak coupling force between molecules among the first adsorption layer A formed on the top surface of the substrate 1 may effectively be removed from the substrate 1 and thus finally enhancing purity of a deposition film that is to be formed. The substrate 1 moves to a lower portion of the first exhaust line 151 so that the first material is effectively exhausted through pumping of the first exhaust line 151.

According to an embodiment, since the first material is sequentially injected and exhausted during the rotation of the body 120, the first material is not concurrently injected and exhausted. That is, when the first material is injected, such an injection may not hinder an exhaust, thereby reducing the possibility and/or preventing a pumping effect of the exhaust portion 111 from having an undesirable influence on the injection.

The body 120 of each of the second and third vapor deposition apparatuses 102 and 103 rotates with the same angular speed at the second time t2 in addition to the first vapor deposition apparatus 101. Also, the substrate 1 moves in connection with the angular speed of the body 120 that is rotating. Thus, the substrate 1 moves to a lower portion of the second vapor deposition apparatus 102 during the exhaust at the second time t2.

Figure 12:
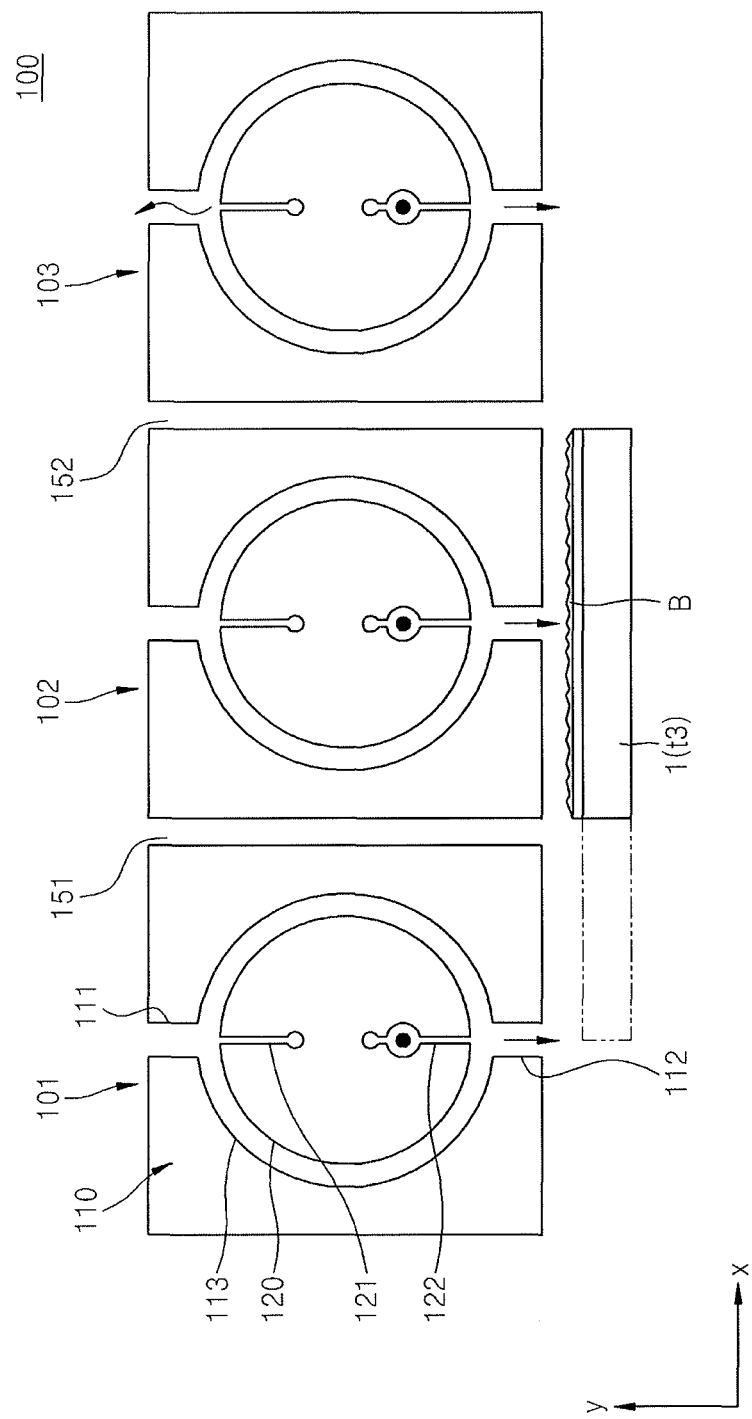

Referring to FIG. 12, next, the body 120 of the second vapor deposition apparatus 102 rotates in one direction and injects the second material toward the substrate 1 through the second injection inlet 122 at a third time t3 at which the second injection inlet 122 and the communicated portion 112 are connected to each other. For example, the second injection inlet 122 injects a radical of the second material generated in the cavity 124 that is a plasma generation space. An example of the radical of the second material includes an oxygen radical. The oxygen radical is formed by injecting $H_2O$, $O_2$, $N_2O$, etc. in the cavity 124 (operation B). The second material is used to form a finally desired deposition layer AB, e.g., $Al_xO_y$ layer, by substituting a part of the first adsorption layer A or reacting with the first adsorption layer A formed by using the first material that is already adsorbed in the substrate 1. In this regard, an excessive amount of the second material is used to form a physical adsorption layer B and remained.

Figure 13:
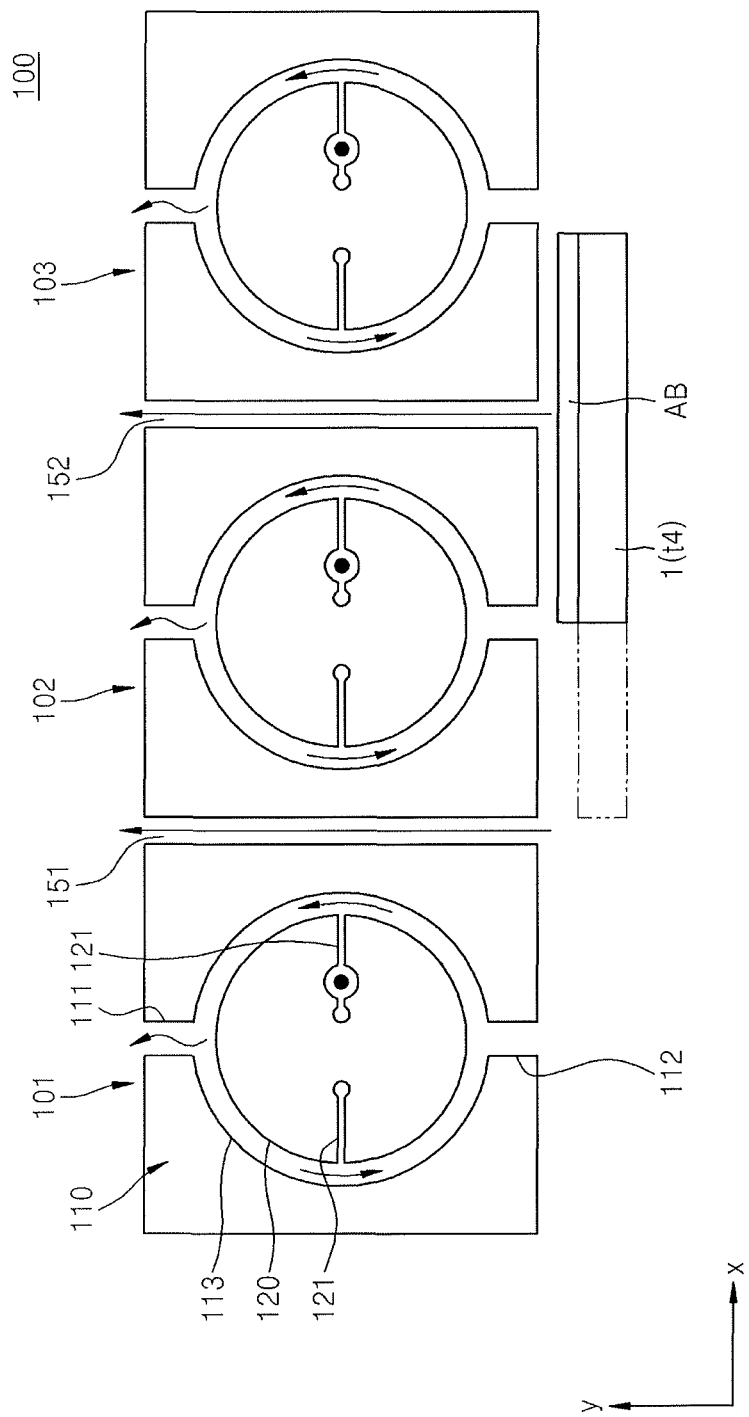
Figure 14:
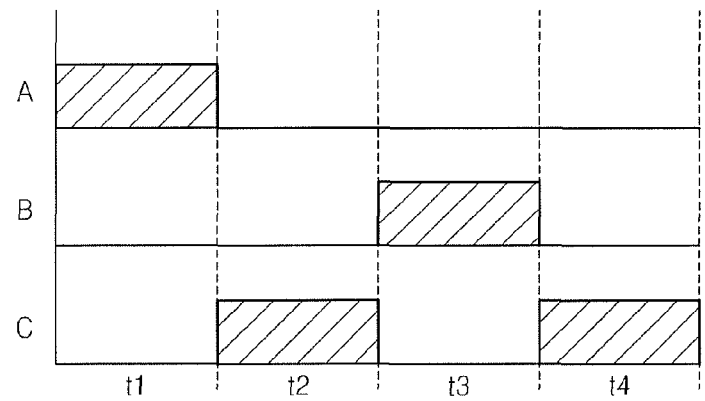
FIG. 14 is a diagram for explaining a process of forming a thin film.

Referring to FIG. 13, next, the body 120 of the second vapor deposition apparatus 102 rotates in one direction and exhausts the second material at a fourth time t4. For example, the adsorption layer having a weak coupling force between molecules among the adsorption layers formed on the top surface of the substrate 1 is effectively removed from the substrate 1 through the pumping of the exhaust portion 111 and thus finally enhancing purity of the deposition film that is to be formed. The substrate 1 moves to a lower portion of the second exhaust line 152 so that the second material is effectively exhausted through pumping of the second exhaust line 152.

A desired monolayer atomic layer is formed on the substrate 1 through the first and second vapor deposition apparatuses 101 and 102. Another substrate may be continuously provided, e.g., may be provided in a repeating pattern, to perform a deposition operation. Also, the substrate 1 may be additionally provided to another vapor deposition apparatus so as to form an additional deposition film.

The deposition operation may be performed when the substrate 1 is fixed to the first vapor deposition apparatus 101. For example, a series of processes of fixing the substrate 1 to correspond to the communicated portion 112, injecting the first material toward the substrate 1 at the first time t1, performing the exhaust operation using the exhaust portion 111 at the second time t2, injecting the radical of the second material toward the substrate 1 at the third time t3, and performing the exhaust operation using the exhaust portion 111 at the fourth time t4 are the same as described with reference to FIGS. 9 and 10. For example, the deposition operation may be advantageously performed in a limited space using the first vapor deposition apparatus 101 at the minimum.

Examples of the first material and the second material are not limited to the above-described examples. For example, $TiCl_4$ is used as the first material and $NH_3$ is used as the second material, and thus a TiN layer may be formed on the substrate 1. As another example, a mixture of tetraethylmethylaminozirconim (TEMAZr) and tetraethylmethylaminosilicon (TEMASi) may be used as the first material, and $H_2$, $O_2$, or $O_3$ may be used as the second material. As a result, a $Zr_xSi_{1-x}O_2$ layer may be formed on the substrate 1.

According to an exemplary embodiment, module type vapor deposition apparatuses are employed to form uniform films at a large area substrate. For example, the module type vapor deposition apparatuses may be advantageously freely disposed for the purpose of user convenience and easily detachable between modules. Thus, the module type vapor deposition apparatuses may be freely disposed vertically and horizontally according to a size of a substrate and thus advantageously a deposition film may be easily formed at the large area substrate.

According to an exemplary embodiment, a thin film forming yield may be maximized at a limited space through a rotating body. A vapor deposition apparatus may sequentially inject a first material and a second material onto a substrate when a substrate is fixed by employing the rotating body. Thus, a vapor deposition line may be excluded, thereby depositing an atomic layer in a minimized space in which only one vapor deposition apparatus is installed. In a case where the substrate moves, a plurality of vapor deposition apparatuses are arranged, and a moving speed of the substrate and an angular speed of a rotating body of each of vapor deposition apparatuses are connected to each other, thereby continuously performing a process of forming a deposition film and providing a plurality of substrates.

According to an exemplary embodiment, exhaust lines are disposed between module type vapor deposition apparatuses to efficiently perform an exhaust operation and concurrently at least one exhaust inlet is disposed in each of the module type vapor deposition apparatuses, thereby minimizing an occurrence of a particle and forming a deposition film having high purity.

Figure 15:
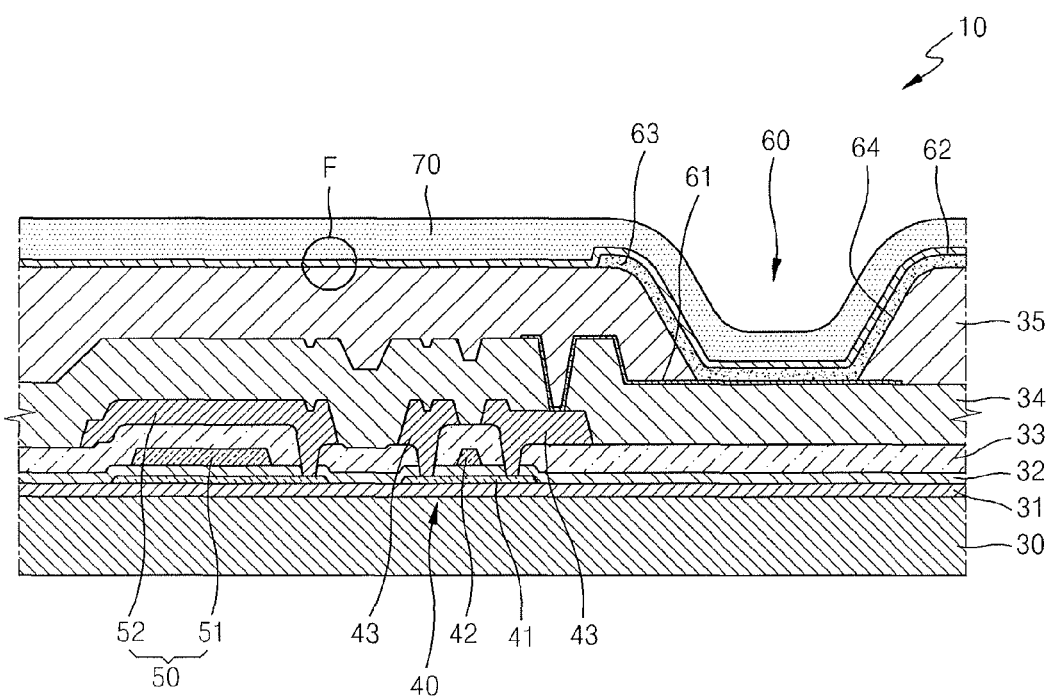
FIG. 15 is a diagram of an organic light-emitting display apparatus manufactured by using the vapor deposition system of FIG. 1, according to an exemplary embodiment.
Figure 16:
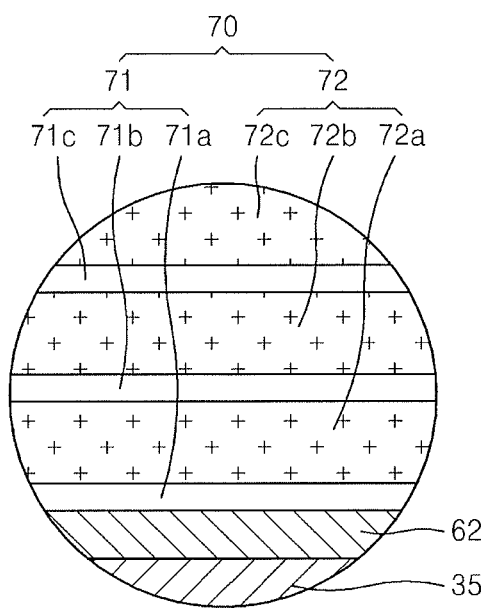
FIG. 16 is a magnified view of a portion F of FIG. 15.

FIG. 15 is a cross-sectional view of an organic light-emitting display apparatus 10 manufactured by using an organic light-emitting display apparatus manufacturing method, according to an exemplary embodiment. FIG. 16 is a magnified view of a portion F of FIG. 15.

In more detail, FIGS. 15 and 16 illustrate the organic light-emitting display apparatus 10 manufactured by using one of the vapor deposition apparatuses 100, 200, and 300. For convenience of description, the vapor deposition apparatuses 100 of FIG. 1 will now be described below.

The organic light-emitting display apparatus 10 is formed on a substrate 30. The substrate 30 may be formed of, e.g., a glass material, a plastic material, or a metal material.

A buffer layer 31 containing a conductive material is formed on the substrate 30 so as to provide a flat surface on the substrate 30, and to reduce the possibility of and/or prevent moisture and foreign substances from penetrating into the substrate 30.

A thin film transistor (TFT) 40, a capacitor 50, and an organic light-emitting device 60 are formed on the buffer layer 31. The TFT 40 includes an active layer 41, a gate electrode 42, and source and drain electrodes 43. The organic light-emitting device 60 includes a first electrode 61, a second electrode 62, and an intermediate layer 63.

For example, the active layer 41 having a predetermined pattern is formed on a top surface of the buffer layer 31. The active layer 41 may contain an inorganic semiconductor material such as silicon, an organic semiconductor material, or an oxide semiconductor material, and may be formed by injecting a p-type dopant or an n-type dopant.

A gate insulating layer 32 is formed on the active layer 41. The gate electrode 42 is formed on the gate insulating layer 32 so as to correspond to the active layer 41. Then, an interlayer insulating layer 33 is formed to cover the gate electrode 42, and the source and drain electrodes 43 are formed on the interlayer insulating layer 33. Here, the source and drain electrodes 43 contact predetermined regions of the active layer 41. A passivation layer 34 is formed to cover the source and drain electrodes 43. A separate insulating layer may be further formed on the passivation layer 34 so as to planarize the TFT 40.

The first electrode 61 is formed on the passivation layer 34. The first electrode 61 is electrically connected to one of the source and drain electrodes 43. Then, a pixel-defining layer (PDL) 35 is formed to cover the first electrode 61. An opening 64 is formed in the PDL 35, and then the intermediate layer 63, including an organic emission layer (organic EML), is formed in a region defined by the opening 64. The second electrode 62 is formed on the intermediate layer 63.

An encapsulation layer 70 is formed on the second electrode 62. The encapsulation layer 70 may contain an organic material or an inorganic material and may have a structure in which the organic material and the inorganic material are alternately stacked.

For example, the encapsulation layer 70 may be formed by using the vapor deposition apparatus 100. That is, when the substrate 30, whereon the second electrode 62 is formed, passes under the vapor deposition apparatus 100, a desired layer may be formed.

According to an exemplary embodiment, the encapsulation layer 70 includes an inorganic layer 71 and an organic layer 72. For example, the inorganic layer 71 includes a plurality of layers 71a, 71b, and 71c, and the organic layer 72 includes a plurality of layers 72a, 72b, and 72c. Here, the plurality of layers 71a, 71b, and 71c of the inorganic layer 71 may be formed by using the vapor deposition apparatus 100. The vapor deposition apparatus 100 may easily form the plurality of layers 71a, 71b, and 71c since the first portion 11 and the second portion 12 are alternately used while a body rotates in one direction and a deposition process is performed while the substrate 30 moves.

However, embodiments are not limited thereto. That is, other insulating layers including the buffer layer 31, the gate insulating layer 32, the interlayer insulating layer 33, the passivation layer 34, the PDL 35, and the like of the organic light-emitting display apparatus 10 may be formed by using the vapor deposition apparatuses 100, 200, and 300.

Also, various thin films including the active layer 41, the gate electrode 42, the source and drain electrodes 43, the first electrode 61, the intermediate layer 63, the second electrode 62, and the like may be formed by using the vapor deposition apparatus 100.

As described above, when the vapor deposition apparatus 100 is used, characteristic of the deposition layer formed by the organic light-emitting display apparatus 10 is improved, and thus an electrical characteristic and an image quality of the organic light-emitting display apparatus 10 may be improved. For example, according to the vapor deposition apparatus, the method of forming a thin film using the same, and the method of manufacturing an organic light-emitting display apparatus of the one or more embodiments, a deposition procedure may be efficiently performed and characteristic of a deposition layer may be easily improved.

By way of summation and review, a vapor deposition method uses one or more gases as source precursors to form a thin film. Exemplary vapor deposition methods include chemical vapor deposition (CVD), atomic layer deposition (ALD), and the like. For example, according to the ALD, after a first material is injected and purged/pumped, a single layer or a composite layer is adsorbed to a substrate, and then another first material is injected and purged/pumped, so that a desired single or composite atomic layer is formed.

Among display apparatuses, an organic light-emitting display apparatus is expected to become a next generation display apparatus due to its wide viewing angles, high contrast, and fast response speeds. The organic light-emitting display apparatus includes an intermediate layer having an organic emission layer (organic EML) between a first electrode and a second electrode which face each other, and also includes one or more various thin films. However, because the organic light-emitting display apparatus has increased in size and is expected to have high definition, it is difficult to deposit a large thin film with desired characteristics. Also, there is limitation in increasing an efficiency of a process of forming the large thin film.

In contrast, embodiments relate to a vapor deposition apparatus, a method of forming a thin film using the same, and a method of manufacturing an organic light-emitting display apparatus, in which a deposition procedure may be efficiently performed and characteristic of a deposition layer may be easily improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims

What is claimed is:

1. A vapor deposition apparatus for depositing a thin film on a substrate, the vapor deposition apparatus comprising:
    a cover including an accommodation portion, and a communicated portion connected to the accommodation portion and facing a direction of the substrate; and
    a body in the accommodation portion, the body including a first portion and a second portion, wherein:
    the first portion is disposed at a first location of the body and connected to a first injection portion for injecting a first material outside of the cover and onto the substrate,
    the second portion is disposed at a second location of the body and connected to a second injection portion for injecting a second material outside of the cover and onto the substrate, and
    the body rotates in at least one direction so that the first portion and the second portion are alternately connected to each other with respect to the communicated portion,
    wherein the body is rotatable relative to the substrate when the substrate is stationary or moves linearly, such that the substrate does not rotate when the body rotates,
    wherein the first material is injected in a direction perpendicular to a surface of the substrate on which the thin film is deposited when the first portion is connected to the communicated portion, and
    wherein the second material is injected in a direction perpendicular to a surface of the substrate on which the thin film is deposited when the second portion is connected to the communicated portion.

2. The vapor deposition apparatus of claim 1, wherein the cover further includes an exhaust portion connected to the accommodation portion.

3. The vapor deposition apparatus of claim 2, wherein a gap for performing an exhaust operation is between an inner surface of the accommodation portion and an outer surface of the body.

4. The vapor deposition apparatus of claim 2, wherein the cover has a polyhedric shape, and the communicated portion and the exhaust portion are formed along different surfaces of the cover.

5. The vapor deposition apparatus of claim 4, wherein a surface in which the communicated portion is formed and a surface in which the exhaust portion is formed face each other.

6. The vapor deposition apparatus of claim 4, wherein the exhaust portion is plural and is formed along various surfaces of the cover.

7. The vapor deposition apparatus of claim 1, wherein the first portion and the second portion are spaced apart from each other.

8. The vapor deposition apparatus of claim 1, wherein the body is a cylindrical shape, and the first portion and the second portion are disposed on a surface of the body along a circumference of the body.

9. The vapor deposition apparatus of claim 8, wherein the first portion and the second portion are spaced apart from each other by a diameter of a bottom surface of the body.

10. The vapor deposition apparatus of claim 1, further comprising:
    a cavity connected to the first injection portion; and
    a plurality of electrodes for generating a radical by applying a voltage to the first material in the cavity.

11. The vapor deposition apparatus of claim 1, wherein the first material includes one or more gases selected from the group of a source precursor, a reactant precursor, inert gas, or a combination thereof.

12. The vapor deposition apparatus of claim 1, further comprising:
    a cavity connected to the second injection portion; and
    a plurality of electrodes for generating a radical by applying a voltage to the second material in the cavity.

13. The vapor deposition apparatus of claim 1, wherein the second material includes one or more gases selected from the group of a source precursor, a reactant precursor, inert gas, or a combination thereof.

14. The vapor deposition apparatus of claim 1, wherein a plurality of vapor deposition apparatuses are arranged along a direction in which the substrate moves, and include exhaust lines for performing the exhaust operation therebetween.

* * * * *